United States Patent [19]

Tsunenari

[11] Patent Number: 4,970,574

[45] Date of Patent: Nov. 13, 1990

[54] ELECTROMIGRATIONPROOF STRUCTURE FOR MULTILAYER WIRING ON A SEMICONDUCTOR DEVICE

[75] Inventor: Kinji Tsunenari, Tokyo, Japan

[73] Assignee: NEC Corporation, Japan

[21] Appl. No.: 359,139

[22] Filed: May 31, 1989

[30] Foreign Application Priority Data

May 31, 1988 [JP] Japan .................... 63-134015

[51] Int. Cl.$^5$ .................. H01L 23/48; H01L 29/46; H01L 29/54; H01L 29/62
[52] U.S. Cl. .......................... 357/71; 357/65; 357/68
[58] Field of Search .............. 357/65, 67, 71, 68

[56] References Cited

U.S. PATENT DOCUMENTS

| 4,107,726 | 8/1978 | Schilling | 357/71 |
| 4,417,387 | 11/1983 | Heslop | 29/591 |
| 4,782,380 | 11/1988 | Shankar et al. | 357/71 |
| 4,812,419 | 3/1989 | Lee et al. | 437/203 |
| 4,816,895 | 3/1989 | Kikkawa | 357/71 |

FOREIGN PATENT DOCUMENTS 0163830 12/1985 European Pat. Off. ............ 357/71
58-200526 11/1983 Japan ........................ 357/71

Primary Examiner—Andrew J. James
Assistant Examiner—Donald L. Monin, Jr.
Attorney, Agent, or Firm—Laff, Whitesel, Conte & Saret

[57] ABSTRACT

A multilayer wiring structure for electromigrationproof comprises a first wiring layer and a second wiring layer separated each other by insulating layer. Each of the first and second wiring layers consists of a core portion and a cladding portion. The core portion consists of a metal having a high resistance to electromigration such as gold or a metallic material having gold as the principal constituent. The cladding portion consists of a material having a good adhesion to the insulating layer. Such material is what selected from tungsten (W), titanium-tungsten alloy (TiW) and molybdenum (Mo). The insulating layer preferably consists of organic insulating material having a good surface-flatness such as polyimide.

3 Claims, 2 Drawing Sheets

ELECTROMIGRATIONPROOF STRUCTURE FOR MULTILAYER WIRING ON A SEMICONDUCTOR DEVICE

BACKGROUND OF THE INVENTION

The present invention relates to an electromigration-proof structure for a multilayer wiring on a semiconductor device, and more particularly to a semiconductor device with multilayer interconnection structure having an interlayer insulating film with excellent surface flatness and a metallic wiring with high resistance to electromigration.

A multilayer wiring structure is extremely effective in semiconductor integrated circuits such as LSI for increasing the level of integration and the packaging density and for decreasing the chip size. In such a case, it is necessary to keep the surface of the interlayer insulating film flat in order to suppress defective step coverage and breaking failure of the upper layer metallic wirings and to obtain a highly reliable multilayer wiring structure.

For these reasons, in the prior art multilayer wiring structures of the above description, organic coating films or the like are used as the interlayer insulating films. In addition, those films are normally used also for passivation films (covering and insulating films). As for a metallic wiring for each layer, Al (aluminum) film has been used to have a good adhesion to the insulating film.

However, in the prior art semiconductor device with multilayer wiring structure as described in the above, the wiring metallic film having Al as the principal constituent has a low resistance to electromigration. Accordingly, these has been a difficulty to use the Al wirings in high speed devices requiring a large current due to a short lifetime of the wirings.

On the other hand, the lifetime of the wirings can be prolonged by using a metallic wiring with Au (gold) as the principal constituent that has a high resistance to electromigration. However, there is another difficulty in putting it to practical use in the conventional structure because of the disadvantage that the adhesion of Au to the interlayer insulating film and the passivation film is poor. For evaluation of the adhesion of a film, it is usual to employ a peeling test which makes use of an adhesive tape. According to this method, adhesion between a film and an underlying material is evaluated in the form of a comparison with the adhesion between the adhesive tape and the film. More specifically, a "block" pattern of squares with side of about 1 mm is incised on the film using a diamond cutter or the like, the adhesive tape is stuck on it and then stripped, and the adhesion is evaluated by counting the number of peeled "blocks" bonded to the tape. For the adhesion performance of the film, it is required in this evaluation method that the number of peeled "blocks" should always be zero. According to the result of the investigation for the combination of Au and an insulating film, the insulating film that can satisfy the standard was only nitride film formed by plasma CVD method. Since, however, the step coverage of this film is extremely poor, it is not possible to apply this film to a flattened multilayer interconnection structure such as is of interest to the present invention.

It is, therefore, a primary object of the present invention to provide a wiring structure having a metallic wiring which can maintain the surface flatness of the interlayer insulating film and the passivation film, and has a high resistance to electromigration.

SUMMARY OF THE INVENTION

The wiring structure in accordance with the present invention, comprises a core metallic wiring of Au or a metallic material including Au as the principal constituent formed on an insulating film or formed between the insulating films, and a cladding layer interposed between the metallic wiring and the insulating film. The cladding layer consists of a material selected from a tungsten, a titanium-tungsten and a molybdenum.

According to the present invention constituted as in the above, it is possible to obtain a metallic wiring with high resistance to electromigration. Further, the surface of the metallic wiring is covered with a film of tungsten, titanium-tungsten or molybdenum which has a good adhesion to the Au film and the organic coating film that constitutes the interlayer insulating film or the passivation film, so that such a metal, being sandwiched between the Au film and the interlayer insulating film or the passivation film, serves as a bonding layer for films on its both sides to secure sufficient adhesion. Therefore, it becomes possible to obtain a semiconductor device with a multilayer interconnection structure having a high resistance to electromigration and high reliability.

DESCRIPTION OF THE PREFERRED EMBODIMENTS

Figure 1:
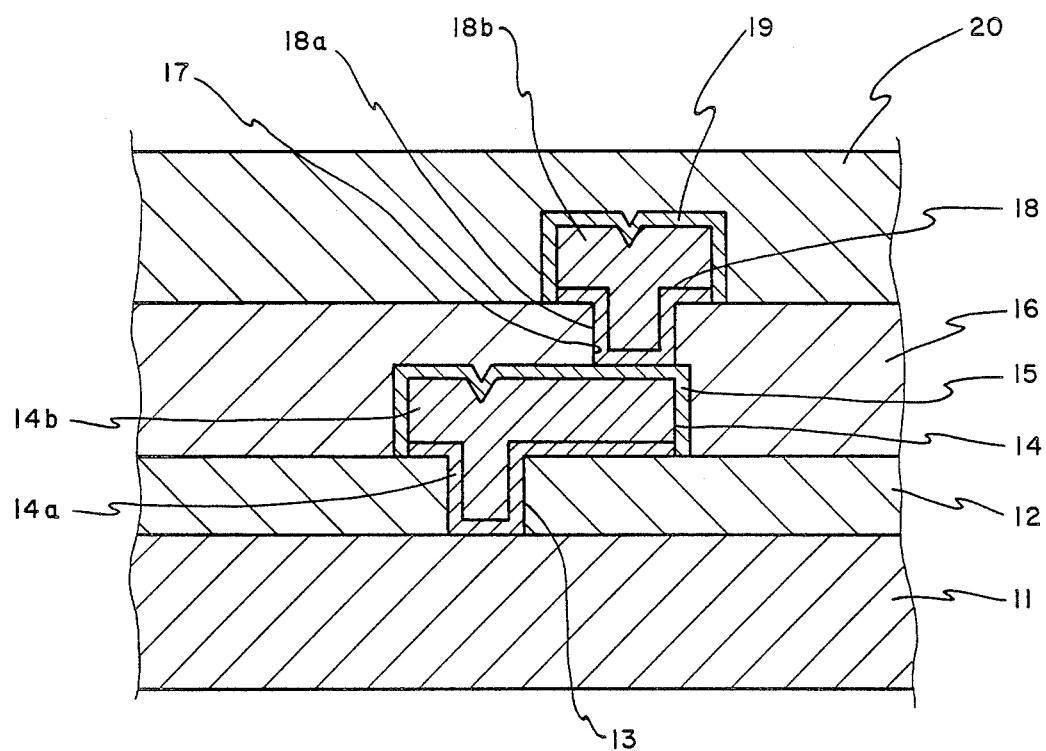
FIG. 1 is a vertical sectional view showing a first embodiment of the present invention as applied to the two-layer wiring structure.

Referring to FIG. 1, a field oxide film 12 formed on an Si (silicon) substrate 11 has a contact hole 13. On the inner surface of the contact hole 13 and on the region where a wiring is to be formed over the field oxide film 12, there is deposited a TiW (titanium-tungsten alloy) film 14a with thickness of about 2000 Å. The TiW film 14a has a good adhesion to the field oxide film 12. Further, on the TiW film 14a there is formed a Au film 14b so as to fill in the contact hole 13, with a substantial thickness of 1.05 μm in the portion above the field oxide film 12. A first-layer metallic wiring 14 is constructed with a two-layer film of the TiW film 14a and the Au film 14b. In addition, on the surface (side faces and the top surface) of the first-layer metallic wiring 14 there is formed a W (tungsten) film 15 with thickness of about 2000 Å.

Then, a polyimide film 16 with a predetermined thickness is formed as an interlayer insulating film on the field oxide film 12 and on the first-layer metallic wiring 14 covered with the W film 15. A through hole 17 is provided at a predetermined position on the W film 15 in the polyimide film 16. On the inner surface of the through hole 17 and in the region planned for forming wiring on the polyimide film 16, there is formed a TiW film 18a of thickness of about 2000 Å. Further, an Au film 18b with a substantial thickness of 1.05 μm in the portion above the polyimide film 16 is formed on the TiW film 18a so as to fill in the through hole 17. With the TiW film 18a and the Au film 18b there is formed a second-layer metallic wiring 18. The surface of the second-layer metallic wiring 18 is covered with a W film 19 which has a high adhesion to a polyimide film 20. The W film 19 has a thickness of about 2000 Å.

Finally, a polyimide film 20 is formed by deposition as a passivation film on the polyimide film 16 serving as an interlayer insulating film and on the second-layer metallic wiring.

Next, the method of fabricating the two-layer interconnection structure of the present embodiment with the above-mentioned constitution will be described.

First, a contact hole 13 is opened at a predetermined position in the field oxide film 12 formed on the Si substrate, by the conventional dry etching technique. Next, TiW film 13 is deposited on the substrate to a thickness of about 2000 Å by a sputtering method, and on top of it an Au film of about 500 Å thickness is deposited by the sputtering method.

Following that, an Au film of about 1.0 $\mu$m is deposited on a region planned for wiring formation by electroplating by the use of a photoresist as the mask and the Au film as the underlying plating base. Subsequently, the photoresist is stripped, and the Au film (about 500 Å) which served as the underlying film for plating that is no longer needed and the lower layer TiW film (about 2000 Å) matching thereto are removed by ion milling.

In this stage, there is formed the first-layer metallic wiring 14 consisting of the TiW film 14a and the Au film 14b that has a substantial thickness of 1.05 $\mu$m.

Next, the W film 15 with thickness of about 2000 Å is deposited only on the surface of the first-layer metallic wiring 14 by a selective chemical vapor deposition. Further, an interlayer insulating film is created by a coating method by forming the polyimide film 16 of a predetermined thickness on the field oxide film 12 and on the first-layer metallic wiring 14 covered with the W film 15. With the steps described in the above, there is obtained the first-layer interconnection structure.

Thereafter, a through hole 17 is opened at a position matching a connecting position on the W film of the polyimide film 16 by employing techniques substantially analogous to those in the case of the first-layer interconnection structure described in the above. Then, after formation of the second-layer metallic wiring 18 consisting of the TiW film 18a with thickness of about 2000 Å and the Au film 18b with thickness of about 1.05 $\mu$m, the W film 19 with thickness of about 2000 Å is deposited on the outside of the metallic wiring 18. Finally, the polyimide film 20 with a predetermined thickness is applied to the surfaces of the polyimide film 16 which is an interlayer insulating film and the second-layer metallic wiring 18 covered with the W film 19, to serve as the passivation film. With the above-mentioned steps there is obtained the second-layer interconnection structure.

In this embodiment, each of wiring consists of core layer of An and cladding layer of TiW and W.

Figure 2:
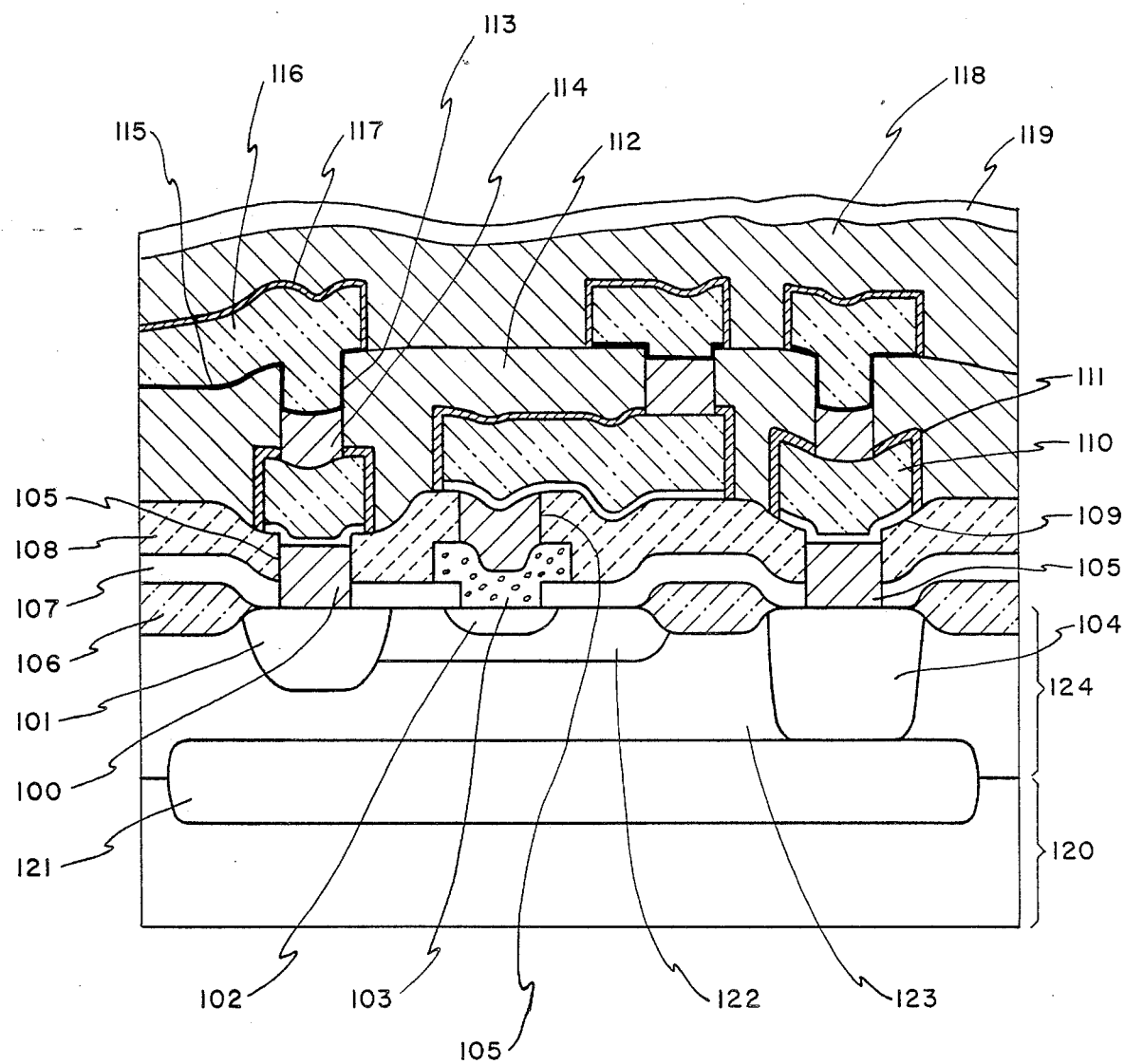
FIG. 2 is a vertical sectional view showing a second embodiment of the present invention as applied to a bipolar device with two-layer wiring structure.

FIG. 2 shows a second embodiment of the present invention in which the two-layer interconnection structure is applied to a bipolar device. In the lower portions of contact holes 105 that are opened respectively on the external base region 101, a polycrystalline silicon layer 103 on an emitter region 102, and a collector electrode lead-out region 104, of a bipolar transistor formed on a Si substrate 120, there are formed W films 106 by a selective CVD method. Covering the interior of the upper part of the contact holes 105 and the region planned for wiring formation on the interlayer insulating film 108, there are deposited TiW films 109 having a thickness of about 2000 Å. The TiW film 109 has a good adhesion to the interlayer insulating film 108. On top of the TiW films 109, there are formed Au films 110 that have a substantial thickness of 1.05 $\mu$m in the portion above the interlayer insulating film 108 so as to bury the upper parts of the contact holes 105, and the two-layer film consisting of the TiW film 109 and the Au film 110 constitute a first-layer of metallic wiring. In the present embodiment, the Au films 110 were formed by electroplating using a photoresist as the mask. Although any one of the plating solutions employed generally in the electronic industry may be used, it is desirable to use noncyanide chemical solution in view of the safety. In the formation of the structure for the present embodiment, use was made of a noncyanide bump plating solution (trade name: Neutronex 210 manufactured by Electroplating Engineers of Japan Co.). Further, W films 111 with thickness of about 2000 Å are formed only on the surface (side faces and top surface) of the first-layer metallic wiring by the selective CVD method. On the interlayer insulating film 108 and on the first-layer metallic wiring covered with the W film 111, there is formed by application a polyimide film 112 with a prescribed thickness (1 $\mu$m in the flat portion over the oxide film) as an interlayer insulating film. In the polyimide film 112, through holes 113 are provided at predetermined positions on the W films 111. The lower parts of the through holes 113 are filled with W films 114 by selective CVD, and the interior of the upper part of the through holes and the regions planned for wiring formation on the polyimide film 112, there are formed TiW films 115 with thickness of about 2000 Å. Further, on top of the TiW films 115 there are formed Au films 116 having substantial thickness of 1.05 $\mu$m in the flat portion above the polyimide film 112 so as to busy the upper parts of the through holes 113. These TiW films 115 and the Au films 116 constitute a second-layer metallic wiring. The surface of the second-layer metallic wiring has a thickness of about 2000 Å similar to the first-layer wiring, and is covered selectively with a CVD-W film 117 that has a high adhesion to the polyimide film. In addition, a two-layer film consisting of a polyimide film 118 with predetermined thickness and a nitride film 119 is deposited as a passivation film on the polyimide film 112 serving as an interlayer insulating film and on the second-layer metallic wiring covered with the W film 117.

In the present embodiment, a polyimide film is used as the interlayer insulating film. The reason for this is that it was formed to be the best material for realizing the structure of the present invention, having advantages such as flatness of coating, low dielectric constant and low film stress. When the thickness of the wiring can be made thin, a spin-on-glass (SOG) film (for example, Type 7 manufactured by Tokyo Applied Chemical Industry Co.) which has an interior coating flatness can also be used. Even in this case, the adhesion to the SOG film is also secured sufficiently by the help of the W film on the Au film. Since, however, a reduction in the thickness of the wiring film results in an increase in the wiring resistance, it means to degrade the operating speed of the device, and hence, judging from the dielectric constant, stress and the like, the use of polyimide as the interlayer insulating film will give rise to the best result. In particular, it is desirable to use an interlayer insulating film obtained by adding Si to polyimide for the purpose of enhancing the adhesive strength between the oxide film and the interlayer insulating film.

In forming the structure of the present invention, W is the best suited metal for covering the surroundings of the Au film, the reasons for this being the following:

(i) It is possible to form films selectively around the Au film by carrying out a selective CVD-W method using $WF_6$ gas, which can reduce the number of processes to a great extent.

(ii) A sufficient adhesion to polymide has been confirmed by the test method mentioned earlier.

(iii) It will not react with Au in the heat treatments (maximum temperature of 400° C.) to which the present structure is subjected during and after formation of the wiring. Therefore, there occurs no mixing with Au and no increase in the wiring resistance, nor arises deterioration in the adhesion. For similar purposes, mobybdenum may also be used. However, the usable source ($MoCl_5$) for the selective CVD method is solid at room temperatures so that it cannot compete with tungsten in view of the ease for handling. Further, nickel, cobalt and the like may be used to form films selectively on Au alone by the use of electrodes plating, but their reaction temperatures with Au are low so that the condition (iii) above cannot be satisfied. In addition, silicides of titanium and various kinds of metals that have been used in semiconductor devices in the past also have low reaction temperatures with Au, so that they are not suited either for the purpose of the present invention.

Next, as to the optimum combinations of the adhesive metallic film and the insulating film, the present invention selected a TiW film for the underside and a W film for the sides and the top surface, of an Au film. TiW can readily be made to form a film by a sputtering method, and it has been known that the reaction of the contained Ti with Au can be disregarded when the Ti content is less than 10%. In addition, its heat resistance satisfies the performance required for the present purpose, and its adhesion shows also a very satisfactory performance equal to or surpassing that of W. Consequently, TiW makes the optimum film to be used for the underside of an Au film. On the other hand, it is not possible by the sputtering method to form a uniform film on the side faces and the top surface of an Au wiring. In particular, when a structure with high aspect ratio for the cross sectional form is aimed at to reduce the wiring resistance, the method cannot be applied to cover the surroundings of the wiring. On the other hand, a W film has advantages that it can be used to form a film on the surface alone of an Au film, with equal thickness on the top and side faced, by the selective CVD method, and for the reasons of items (ii) and (iii) above it is considered to be the optimum film for covering the surroundings of the wiring.

As has been described in the foregoing, in accordance with the present invention, use is made for the metallic wiring constituting the interconnection structure for each layer of Au or a metallic material having Au as the principal constituent that has an excellent resistance to electromigration. In addition, the surface of the metallic wiring is covered with the film of high-melting point metal such as tungsten or molybdenum, so that it becomes possible to use a high performance interlayer insulating film like polyimide with extremely satisfactory flatness and electrical and mechanical characters which used to be unable to employ because of the unsatisfactory adhesion to Au. As a result, it becomes possible to provide an optimum wiring system for highly reliable multilayer interconnection structure applicable to high speed devices and the like that require a large current.

What is claimed is:

1. A multilayer wiring electromigrationproof structure comprising: a first wiring layer formed above a semiconductor substrate and having a protruding contact portion extending toward said semiconductor substrate, so as to be electrically connected thereto, a second wiring layer formed above said first wiring layer and having a protruding contact portion extending toward said first wiring layer so as to be electrically connected thereto, and a polyimide layer separating said first and second wiring layers except for said contact portion connecting therebetween, each of said first and second wiring layers consisting of a gold core layer sheathed with a tungsten cladding layer and a titanium-tungsten alloy cladding layer, said tungsten cladding layer being formed on top and side surfaces of said gold layer while said titanium-tungsten alloy cladding layer is formed on underside surface and said protruding contact portion of said gold core layer such that said titanium-tungsten alloy cladding layer of said second wiring layer is in contact with said tungsten cladding layer of said first wiring layer.

2. A multilayer wiring structure comprising: a semiconductor layer, a first insulating layer formed on said semiconductor layer, said first insulating layer having a first throughhole, a first titanium-tungsten alloy layer selectively formed on said first insulating layer to provide a first wiring pattern, said first titanium-tungsten alloy layer being connected to said semiconductor layer through said first throughhole, a first gold layer formed on said first titanium-tungsten alloy layer, a first tungsten layer formed on top and side surfaces of said first gold layer such that said first gold layer is entirely sheathed with said tungsten layer and said titanium-tungsten layer, a second insulating layer commonly formed on said first insulating layer and said tungsten layer, said second insulating layer having a second throughhole located on said tungsten layer, a second titanium-tungsten alloy layer selectively formed on said second insulating layer to provide a second wiring pattern, said second titanium-tungsten alloy being connected to said first tungsten layer through said second throughhole, a second gold layer formed on said second titanium-tungsten alloy layer, a second tungsten layer formed on top and side surfaces of said second gold layer and a third insulating layer commonly formed on said second insulating layer and said second tungsten layer.

3. A multilayer wiring structure according to claim 2, wherein said second insulating film consists of polyimide.

* * * * *